United States Patent [19]

Richmond et al.

[11] Patent Number: 4,489,413
[45] Date of Patent: Dec. 18, 1984

[54] APPARATUS FOR CONTROLLING THE RECEIVE AND TRANSMIT FREQUENCY OF A TRANSCEIVER

[75] Inventors: Robert L. Richmond, Fairfax, Va.; John E. Corrigan, Washington, D.C.; Paul F. Wyar, Arlington, Va.

[73] Assignee: M/A-COM DCC, Inc., Germantown, Md.

[21] Appl. No.: 399,573

[22] Filed: Jul. 19, 1982

[51] Int. Cl.³ .............................................. H04B 1/50
[52] U.S. Cl. ....................................... 370/30; 370/32; 455/86
[58] Field of Search ...................... 370/30, 32; 455/75, 455/86, 87

[56] References Cited

U.S. PATENT DOCUMENTS 3,230,453  1/1966  Boor et al. ........................... 325/67
3,611,139 10/1971  George ................................. 325/6
3,683,279  8/1972  Weinberg et al. ................... 343/6.8
4,063,173 12/1977  Nelson et al. ...................... 343/6.8 R
4,117,405  9/1978  Martinez ............................. 331/2
4,186,344  1/1980  Higuchi et al. ...................... 455/86
4,325,140  4/1982  Stitzer ................................. 455/86
4,353,127 10/1982  Richardson ......................... 370/32
4,411,018 10/1983  Amoroso, Jr. ...................... 455/75

Primary Examiner—Douglas W. Olms
Attorney, Agent, or Firm—Pollock, Vande Sande & Priddy

[57] ABSTRACT

Apparatus for maintaining a transmit radio signal frequency in a predetermined frequency relationship with a received radio signal. A common voltage controlled frequency source serves as an Lo signal generator for both the receiver and transmitter. A reference frequency oscillator is phase compared with a receive IF signal to derive a control voltage for the voltage controlled frequency source. The resulting phase lock loop provides transmit signal frequency control with respect to a received signal.

16 Claims, 2 Drawing Figures

4,489,413

APPARATUS FOR CONTROLLING THE RECEIVE AND TRANSMIT FREQUENCY OF A TRANSCEIVER

BACKGROUND OF INVENTION

The present invention relates to digital communications transmission services for multiple subscribers. Specifically, subscriber frequency control terminal equipment for transmitting and receiving data to and from a central station at microwave frequencies are described.

A large scale continental data communications system between central locations via satellite has been proposed by the telecommunications industry in a proposal before the Federal Communications Commission identified as a Pilot Demonstration Network. The system employs communications by satellite between central locations. Each central location has a capability of interconnecting a plurality of subscribers to the satellite through cable or by the use of TDMA and TDM radio services between subscribers and the central locations.

When using TDMA and TDM services, each subscriber is provided with a full duplex transceiver which operates in the 10 GHZ microwave frequency spectrum. The TDM signal sent to all subscribers in a given geographical area comprises packets of data information, which may be addressed to individual subscribers. The subscriber's transceiver identifies the packet contained in the TDM signal which is addressed to a specific subscriber. The identified data is decoded and inserted in memory for later use by the subscriber.

The subscriber may begin transmitting data in accordance with timing information contained in the received TDM signal. At the appropriate time, the subscriber transmits data to the central station on a microwave frequency which is offset from the TDM carrier signal frequency in a full duplex mode. When the TDMA signal has been transmitted its carrier signal ceases, providing an opportunity for transmission of yet another subscriber's TDMA signal at the same frequency.

In systems of this type, it is necessary to establish a TDMA signal carrier frequency which is maintained within a specified frequency tolerance between each subscriber station since the receiver frequency at the central location is fixed. Further, since the TDM and TDMA signals are simultaneous, it is necessary to maintain a predetermined frequency differential between the signals.

Various techniques for maintaining the required frequency tolerance for the TDMA signal are possible. However, most techniques require a high stability, local reference oscillator which controls the TDMA carrier frequency. The present invention seeks to provide TDMA carrier frequency control referenced to the TDM carrier signal frequency without the use of a highly stable local reference oscillator.

SUMMARY OF INVENTION

It is an object of this invention to provide frequency control for a carrier signal in a full duplex communications system.

It is still another object of the invention to provide frequency lock between a transmit TDMA signal and a received TDM signal.

These and other ojects are provided by apparatus in accordance with the present invention. First and second frequency conversion means responsive to a receive signal and to a transmit signal, respectively, share a common voltage controlled radio frequency signal source. A frequency error detector generates an error voltage for controlling the RF source by comparing the receive IF signal frequency with a predetermined frequency. The transmit signal frequency stability is maintained within a predetermined stability with respect to a received signal. In a preferred embodiment of the invention, an internal reference frequency oscillator signal having a stability less than the stability of a received signal, such as TDM signal, is phase compared with the IF signal. The resulting error voltage from the comparator is used to control the voltage controlled oscillator in the radio frequency (RF) source. The RF source signal thus serves as the local oscillator for the transceiver transmit signal and the local oscillator for the receive signal.

The closed loop frequency accuracy of the voltage controlled oscillator is dependent upon the phase-locked loop formed by the reference oscillator and frequency conversion circuitry which derives the intermediate frequency. The frequency drift of the voltage controlled oscillator is effectively limited to the drift of the lower frequency reference oscillator, permitting the use of a low cost oscillator which has a free-running stability less than that required by the overall system. Since the same local oscillator is used for transmit and receive operation, the transmit frequency is effectively controlled by this technique.

In a preferred embodiment of the invention, a voltage-tunable RF source serves as one of two local oscillators for a transceiver having a double conversion receiver. The RF source also provides a transmit local oscillator signal which is mixed with an IF modulated signal. The first IF signal is converted by a second, free-running, local reference signal oscillator into a second IF signal for demodulating. The reference signal oscillator is frequency-divided in a digital circuit with divisor 8M to provide a reference signal. The second IF signal is frequency-divided by divisor M for phase comparison with the frequency-divided reference signal. An error signal is generated proportional to the phase difference between these two frequency-divided reference signals. The error signal is applied to control the frequency of the RF source.

The frequency drift of the RF source is thus limited to the algebraic difference of the reference signal drift and the second IF signal drift. Since, however, the second IF signal drift is in the same direction to the reference signal drift, the net frequency drift imparted to the VCO is:

$$\Delta F_{RF} = \Delta F_2 - \Delta IF_2$$

where $\Delta F_2$ is the frequency drift in cycles of the fixed reference signal oscillator, $\Delta IF_2$ is the frequency drift of the second IF signal. Also, after phase-lock is achieved, $\Delta IF_2 = (\Delta F_2/8)$, so $F_{RF} = F_2(\frac{7}{8})$. The net stability of the transmit carrier is therefore maintained relative to a receive signal carrier frequency within the above frequency error, excluding the transmitted modulator frequency error.

DETAILED DESCRIPTION OF THE PREFERRED EMBODIMENT

Figure 1:
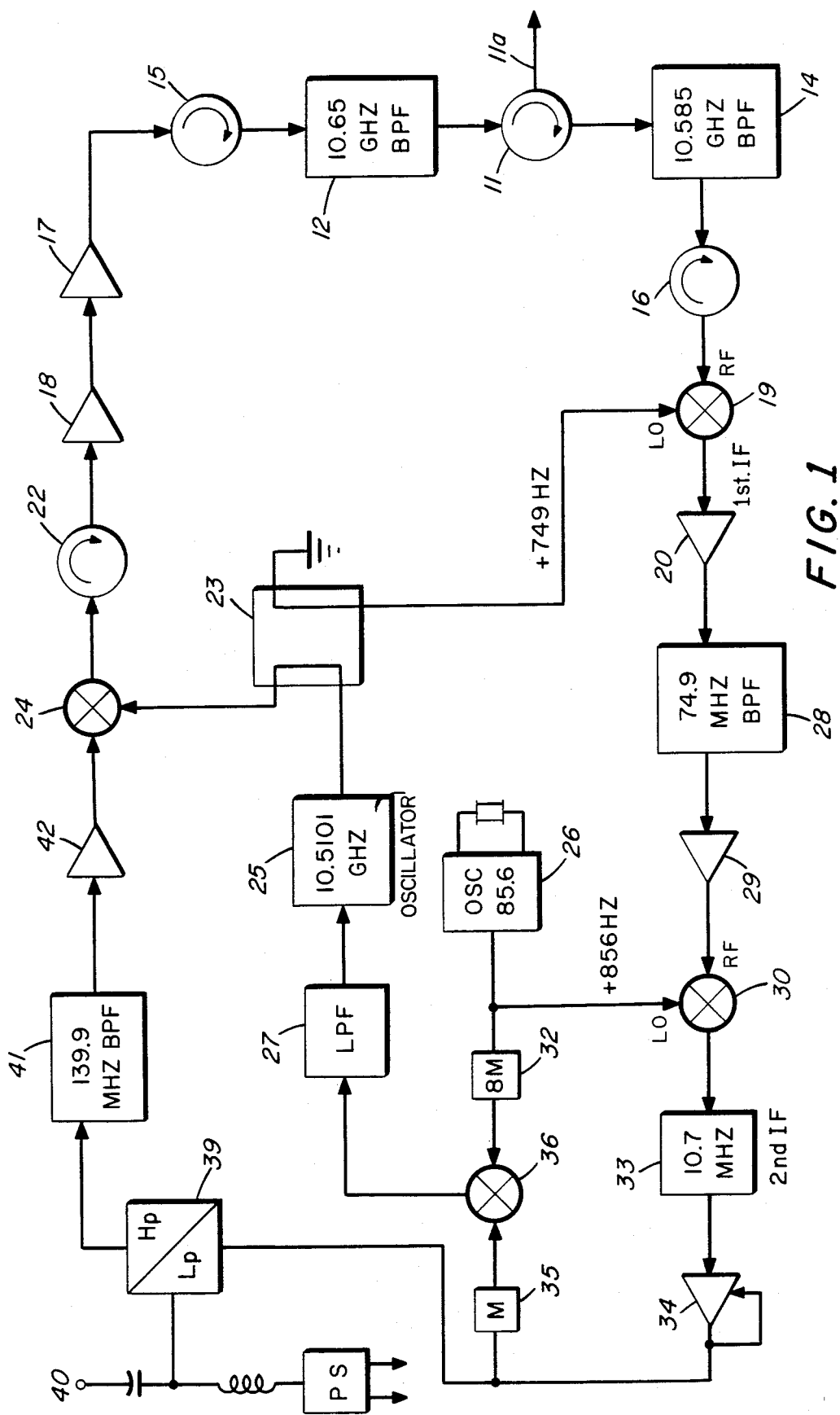
FIG. 1 is a block diagram of one embodiment of a frequency control apparatus in a transceiver used in TDM/TDMA communications systems.

Referring now to FIG. 1, there is shown a first embodiment of a frequency control apparatus for a transceiver used in TDM/TDMA communications services. The transceiver is connected to an antenna or communications channel via a port 11A of a ferrite circulator 11. Circulator 11 will supply a transmit signal from the bandpass filter 12 to the antenna through port 11A, and provide a received signal from port 11A to the bandpass filter 14. Filters 12 and 14 are selected to have passbands which are centered at the transmit carrier frequency and the received carrier frequency respectively. In the embodiment shown, the receive bandpass filter 14 has a center frequency of approximately 10.585 GHZ. The transmit bandpass filter has a center frequency of approximately 10.65 GHZ. The filtered receive signal is applied to an isolator 16 and thereafter applied to the RF input of a mixer 19.

A local oscillator (Lo) signal for mixer 19 is derived from a RF source 25, having a center frequency of approximately 10.5101 GHZ. A coupler or power divider 23 applies the output of the voltage controlled oscillator 25 to a mixer 24 and the Lo input of mixer 19. The voltage controlled oscillator 25 serves as a local oscillator for mixer 19 as well as a local oscillator signal for the transmitter of FIG. 1. Mixer 24 receives as an input from amplifier 42 transmit IF modulated information which is mixed with the local oscillator signal from the RF source 25. The transmit signal is applied through an isolator 22 to two further stages of amplification from amplifiers 17 and 18. A ferrite isolator 15 receives the amplified signal for filtering by bandpass filter 12.

Thus, it is seen that both the transmit signal frequency and the first IF signal frequency are under direct control of the RF source 25. RF source 25 is controlled by the received TDM signal after conversion to a first IF signal, and thence to a second IF signal in a manner to be explained.

The first IF signal is amplified at amplifier 20 and further filtered with a bandpass filter having a center frequency of 74.9 MHZ. This first IF signal is further amplified by amplifier 29 and thence applied to the RF input of mixer 30. The Lo input of mixer 30 is connected to a fixed frequency oscillator 26, having a reference frequency of approximately 85.6 MHZ. A second IF signal is derived from mixer 30 which signal is typically centered at 10.70 MHZ. The second IF signal is filtered in bandpass filter 33 and thence applied to an AGC amplifier 34 where its signal level is fixed at typically −18 dBM.

The derived second IF signal is applied to the first input of a diplexer 39 which is capable of passing the IF signal onto an output terminal 40. Output terminal 40 provides the IF receive information as well as receives the IF transmit signal for transmission. The diplexer 39 has a second output for providing the IF transmit signal. Those skilled in the art will recognize that such diplexers maintain isolation between the transmit and receive ports due to the frequency selectivity of the device itself. The base band generator for providing the intermediate frequency transmit signal and for demodulating the receive second IF signal is conventional.

Frequency control is provided by comparing the frequency divided output signal from the fixed reference frequency oscillator 26 to the derived second IF signal. A phase comparator 36 receives a frequency divided signal from divider 32 (which has a divisor of 8M) on one input of phase detector 36. A second input of the phase detector 36 receives a frequency divided version of the second IF signal via divider 35. As shown in the figure, the second divider (35) has a divisor of M, to indicate that the ratio of the oscillator 26 output signal to the IF signal is 8 to 1 in frequency.

The derived phase detected error signal is applied to a lowpass filter 27. Lowpass filter 27 typically has a cutoff frequency of 50 cycles.

The RF source 25, lowpass filter 27, phase detector 36 form a second order, phase lock loop with oscillator 26 which serves as a reference signal. Oscillator 26 has a long term stability of typically one part in $10^{-5}$. A stability of this margin is translated at the input of mixer 36 as equivalent to a frequency drift of $\pm 107$ HZ.

The second IF signal will also have a frequency drift in the order of 107 HZ after the system has acquired phase-lock.

Referring to mixer 30, its Lo input may drift high by as much as 856 Hz ($10^{-5} \times 85.6$ MHz). Under these conditions, the error voltage at LPF 27 will cause the RF source to change frequency until the frequency offset at phase detector 36 becomes zero. Since (as mentioned above) the frequency reference provided by divider 32 is 107 Hz high under these conditions, the phase-locked loop will cause the second IF frequency to become 107 Hz high also. Observing the frequency relationships at mixer 30 indicates that in this case, the RF source frequency error will be +749 Hz. Of course, an equal and opposite effect will occur if the reference oscillator were to drift toward a lower frequency.

The frequency of the RF source 25 is therefore held to $\pm 749$ HZ with respect to the received TDM signal. This corresponds to a stability in excess of $10^{-7}$ with respect to the receive carrier signal. The local oscillator signal from RF source 25 may therefore never drift more than 749 cycles away from its correct value with respect to the received signal derived from circulator 11.

The transmit signal is provided by frequency translating the IF signal applied to mixer 24 from amplifier 42 up to the microwave transmit carrier frequency. The translated signal is thereafter applied to the circulator 22 for transmission at the same time a receive signal is being processed.

The TDM/TDMA controller connected to terminal 40 provides timing and enabling signals in which to determine when to supply a transmit IF signal in accordance with the TDM/TDMA format. This circuitry for enabling transmission by the transceiver of FIG. 1 has been omitted but is well within the skill of those in the art.

Thus, there has been described a frequency control apparatus which will maintain a transmit signal carrier frequency within a predetermined frequency range of a receive signal. With apparatus such as shown in FIG. 1, it is possible to maintain the transmitted signals from a plurality of subscribers within a predetermined frequency range of the central transmitting facility TDM signal. Thus, an inexpensive oscillator 26 having a moderate stability of one part in $10^5$ is capable of controlling the frequency of a subscriber's transmission to within a very narrow stability greater than $10^{-7}$ with respect to a receive signal. This enables inexpensive subscriber equipment without requiring a wide band receiver at the central facility to receive and decode subscriber transmission signals which are spread in frequency.

Figure 2:
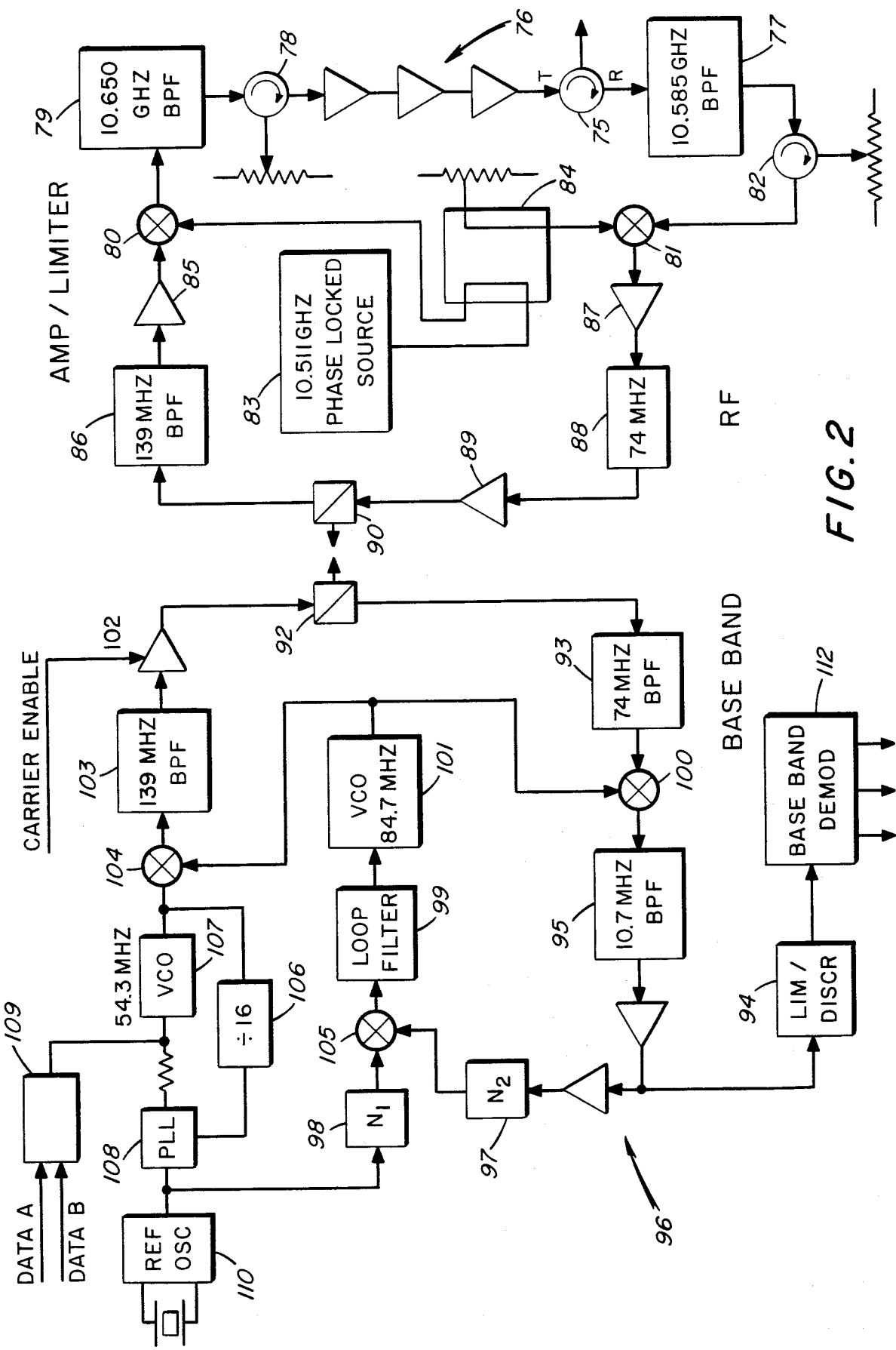
FIG. 2 is a block diagram of yet another embodiment of a frequency control apparatus in a transceiver for TDM/TDMA communications.

The structure of FIG. 2 may be implemented by frequency controlling the baseband generated signals rather than the first Lo oscillator and frequency translator signal as shown in FIG. 1. Such an alternative is shown in FIG. 2.

Referring now to FIG. 2, there is shown another transceiver used by subscribers of TDM/TDMA communications which accomplishes frequency control for a transmit carrier signal by forming a second order phase lock loop with a derived intermediate frequency signal of the TDM received carrier signal. The transceiver of FIG. 2, however, uses phase lock control of a voltage controlled oscillator forming a second Lo in the receive chain as distinguished from the apparatus in FIG. 1, which controls the frequency of a voltage controlled oscillator used as a local oscillator in the first conversion stage. The transceiver of FIG. 2 comprises the circulator 75 which receives and supplies signals from and to an antenna for communicating with a central station. The receive port of isolator 75 is connected to a receive bandpass filter 77 having a center frequency of 10.585 GHZ. As in the previous embodiment, the output of the filter is connected to an isolator 82 before applying the signal to an RF input of a mixer 81.

The transmit pot of the circulator 75 receives the amplified signal for transmission to the central TDM facility.

A power divider 84 provides a common signal to the Lo input of mixer 81 and to the RF input of mixer 80, whereby frequency translation of a transmit IF signal and the received TDM signal occurs. The transmit IF signal is supplied by a diplexer 90 through an appropriate bandpass filter 86 centered at the transmit IF frequency of 139 MHZ. An amplifier 85 buffers the mixer 80 input to provide the appropriately translated signal to bandpass filter 79. Bandpass filter 79 is of course centered at the transmit frequency of 10.650 GHZ.

The fixed frequency source 83 is a 10.511 GHZ phase lock source having an overall stability of one part in $10^5$. The phase lock source 83 is commercially available and because of its relatively low stability, does not add undue cost to the transceiver.

Diplexer 90 also receives the first IF signal converted by mixer 81. The IF signal is applied through amplifier 87 to bandpass filer 88 having a center frequency at the first IF signal or 74 MHZ. The resulting output is applied to amplifier 89 which maintains the first IF signal level at a nominal level of $-18$ dBM.

The output of the diplexer 90 is transmitted along a cable or other interface to a baseband module. The baseband module includes a diplexer 92 for providing a receive and transmit path to the baseband module. The receive path includes a bandpass filter 93 having a center frequency of 74 MHZ. The filter provides a first signal to the RF input of a mixer 100. The local oscillator signal for the mixer 100 is provided by a voltage controlled oscillator 101. The voltage controlled oscillator has a center frequency of 84.7 MHZ capable of deviating plus or minus 110 KHz.

A phase lock loop is formed from the output of mixer 100 which comprises a second IF signal having a frequency of 10.7 megacycles. The second IF signal is amplified and filtered by filter 95 and amplifier 96 respectively. As in the previous embodiment, the second IF signal is applied to a phase detector 105 via a divider 97. A reference oscillator 110 provides a signal having a frequency of 84.7 MHZ and a stability of $10^{-5}$. A divider 98 divides the reference oscillator 110 signal frequency down to the IF signal frequency applied to phase detector 105. As in the first embodiment, common to phase lock loops, is a loop filter 99 having a lowpass characteristic with a cutoff frequency of substantially 50 HZ.

The receive TDM signal is converted first in mixer 81 to a first IF signal, and thence to a second IF signal through mixer 100. The VCO 101 will frequency lock with the derived first IF signal having a stability determined by the ratio of the dividers 98 and 97. As in the first case, the frequency offset of voltage control oscillator 101 will be determined by the difference between the frequency drift of the IF signal of divider 97, and the drift of the signal from divider 98. As the ratio of N1 to N2 is 8 to 1, approximately ⅛ of the frequency drift associated with voltage controlled oscillator 101 with respect to the receive TDM signal will be ⅛ of the frequency drift of oscillator 110. Therefore, VCO 101 will experience a drift in the neighborhood of 749 HZ. This frequency drift when related to the transmit frequency of 10.650 GHZ provides stability with respect to the receive TDM signal of better than $10^{-7}$.

The output of voltage controlled oscillator 101 is also applied to a frequency translator 104 which converts the modulated subcarrier from voltage controlled oscillator 107 to the required 139 MHZ intermediate frequency transmit signal. An amplifier 102 applies the intermediate frequency transmit signal to a diplexer 92.

The subcarrier generator, VCO 107, is a conventional phase lock loop including a phase detector 108, divider 106, and VCO 107. The VCO 107 is modulated in four level FSK by a modulator 109 receiving first and second data signals. The details of the modulator are of course common to all TDM/TDMA systems and are within the skill of those practicing in the art.

Thus, it has been described with respect to two embodiments, a frequency control apparatus in a TDM/TDMA system for receiving and simultaneously transmitting TDM and TDMA signals to and from subscriber locations and a central facility. The TDM and TDMA signal formats are known in the art, and the required circuitry for gating the transceiver into a transmit mode has been deleted for clarity. With the transceiver of FIGS. 1 and 2, a stability of better than $10^{-7}$ is achieved with respect to the receive signal, thereby reducing the bandwidth requirements of the central location receive capability. Those skilled in the art recognize still other embodiments of the invention, as defined in the claims which follow.

Although the specification has described with particularity two embodiments of the invention, including specific frequencies, frequency tolerances and filter parameters, those skilled in the art will be aware that the invention can be applied in a wide variety of contexts. The description should be taken as descriptive and not as limiting the scope of the invention.

What is claimed is:

1. An apparatus for controlling the receive and transmit frequency of a transceiver comprising:

means for receiving a radio frequency carrier signal having information for demodulating at a first radio frequency;

first frequency conversion means comprising a first mixer having a first input connected to receive said radio frequency carrier signal;

a voltage controlled frequency source having an output signal connected to a second input of said mixer whereby said mixer provides a first intermediate frequency signal;

a second frequency conversion means having a second mixer connected to receive said first intermediate frequency signal containing information for demodulating and producing a second mixer output signal;

a local oscillator providing a reference signal to said second mixer;

frequency detector means providing a control signal to said voltage controlled frequency source establishing frequency control for said voltage controlled frequency source to produce a voltage controlled signal;

means for mixing said voltage controlled signal with a signal to be transmitted;

whereby said signal to be transmitted and said signal containing information are frequency controlled by said voltage controlled frequency source.

2. In an apparatus for simultaneously transmitting and receiving modulated radio frequency signals, a frequency control apparatus for generating a transmit carrier and receive intermediate frequency signal comprising:

a voltage controlled frequency source having an output signal with frequency proportional to a control voltage;

means for mixing said voltage controlled frequency source output signal with an incoming radio frequency signal whereby an intermediate frequency signal is provided;

a fixed frequency reference oscillator;

means for phase comparing the intermediate frequency signal with said fixed frequency oscillator signal, said means applying an error signal to said voltage controlled frequency source whereby said voltage controlled frequency source output signal maintains a substantially constant frequency relationship with said incoming radio frequency signal; and means for combining an informaion signal with said voltage controlled frequency source output signal whereby a transmit signal is formed having a frequency determined by said incoming radio frequency signal.

3. The apparatus of claim 2 wherein said means for mixing comprises:

a first mixer for receiving said voltage controlled frequency source output signal and an incoming receive signal; and a second mixer for receiving an output signal from said first mixer and said reference signal oscillator, said second mixer providing said intermediate frequency signal having said information contained therein.

4. The apparatus of claim 3 wherein said means for phase comparing includes a frequency divider connected to said reference signal oscillator; and a phase detector connected to receive a signal from said divider and said intermediate frequency signal, said phase detector operatively connected to provide a control voltage for said voltage controlled frequency source.

5. The apparatus of claim 4 wherein said means for combining an information signal comprises a third mixer connected to receive an intermediate frequency signal modulated with an information signal and said voltage controlled frequency source output signal.

6. The apparatus of claim 5, further comprising a directional circulator, having a first port for receiving a signal from said means for combining, a second port connected to a channel for transmitting and receiving radio frequency signals, and a third port connected to said first mixer whereby incoming radio frequency signals are transmitted to said first mixer and outgoing radio frequency signals are transmitted to said channel.

7. An apparatus for controlling the transmit and receive frequency for a transceiver, said transceiver of the type for simultaneously receiving and transmitting radio frequency signals at different frequencies comprising:

a directional circulator having a first port connected to a communications channel, second and third ports providing a receive path and transmit path for said transceiver;

a voltage controlled frequency source;

a mixing means having an RF port connected to said receive path, and an Lo port connected to said voltage controlled frequency source, and an intermediate frequency port;

a frequency translator having an output port connected to said transmit port and first and second input ports connected to receive a voltage controlled frequency source output signal and a transmit information signal;

a reference signal generator for providing a signal for phase comparison with an intermediate frequency signal from said mixing means; and phase comparison means connected to receive a signal from said reference signal generator and said intermediate frequency signal from said mixing means intermediate frequency port, said phase comparison means providing a control voltage for said volage controlled frequency source whereby the intermediate frequency signal and transmit signal are frequency controlled by received radio frequency signals.

8. The apparatus of claim 7 wherein said mixing means includes first and second mixing stages, said first mixing stage having an Lo input connected to said voltage controlled frequency source, and an RF port connected to said receive path, and said second mixing stage connected to receive a first intermediate frequency signal from said first mixing stage and connected to receive a second Lo signal from said reference signal generator whereby a second intermediate frequency signal is produced containing a received information signal.

9. The apparatus of claim 8 wherein said reference signal generator provides first and second frequency related signals, said first frequency related signal connected to said phase comparison means and said second frequency related signal comprising said second Lo signal for said second mixing stage.

10. In a system for simultaneously transmitting and receiving information on a radio frequency signal carrier, apparatus for establishing a transmit frequency under control of a received carrier frequency signal comprising:
- a transmit-receive isolator having a first port connected to a communications channel and second and third ports for providing isolated transmit and receive paths to and from said communications channel;
- a voltage controlled local frequency source;
- a source of data to be transmitted;
- a first frequency conversion means for providing a transmit signal to said transmit path, said first frequency conversion means having a first input connected to receive said data, a second input connected to receive a signal from said voltage controlled frequency source;
- a mixing means connected to receive a signal from said receive path and a signal from said voltage controlled frequency source, said mixing means providing an intermediate frequency signal;
- a reference oscillator having a frequency substantially identical with the frequency of said intermediate frequency signal; and
- error detecting means connected to receive said intermediate frequency signal, and a signal from said reference oscillator, said error detecting means providing a control voltage to said volage controlled frequency source whereby transmit signal frequency stability is controlled in response to a received radio frequency signal.

11. The apparatus of claim 10 wherein said received radio frequency signal has a frequency stability greater than said reference oscillator output signal.

12. The apparatus of claim 10 wherein said reference oscillator output signal stability is 1/10 said receiver signal stability.

13. In a system for transmitting an information signal at a first carrier frequency, and receiving an information signal at a second carrier frequency, an apparatus for maintaining the transmitted information signal carrier frequency in a predetermined frequency relationship with the received information signal carrier frequency comprising:
- a fixed frequency reference oscillator;
- a voltage controlled frequency source;
- means forming an intermediate frequency signal from said voltage controlled frequency source output signal and said received information carrier signal;
- means for comparing the phase of said intermediate frequency signal and said fixed frequency reference oscillator output signal generating an error signal in response thereto, said error signal connected to a frequency control input of said voltage controlled frequency source;
- whereby said voltage controlled frequency source frequency is established in a fixed relationship with said information signal carrier frequency; and
- means for combining a portion of said voltage controlled frequency source output signal with an information signal whereby a carrier frequency signal bearing said transmitted information is produced having a frequency controlled by said received information signal carrier.

14. In a transceiver apparatus for simultaneously transmitting information at a first carrier frequency and receiving information at a second carrier frequency, an apparatus for maintaining a transmit signal in a predetermined frequency relationship with a receive signal comprising:
- an insolator for providing a receive and transmit path from and to a communications channel;
- a frequency translator having an output port connected to said transmit path, and first and second input ports,
- a mixer having an RF input port connected to said receive port, an Lo port and IF port;
- a fixed frequency source providing a signal to said Lo port and said second input port whereby said frequency translator provides a signal combined from said frequency source signal and an input IF signal on said first port, and said mixer provides a first baseband IF receive signal;
- a baseband demodulator connected to receive said receive IF signal, said demodulator including;
- a mixing stage connected to receive said receive IF signal;
- a voltage controlled oscillator connected to said receive mixing stage;
- a second fixed reference signal generator for generating a signal having a frequency within the frequency range of said voltage controlled oscillator;
- and means for comparing the frequency of said second fixed frequency reference oscillator with said mixing stage output signals, said means for comparing providing an error signal to said voltage controlled oscillator whereby said voltage controlled oscillator assumes a frequency under control of said IF signal frequency;
- a baseband transmitter comprising:
- a modulator for providing a modulated output signal; and
- baseband translation means for combining a portion of said voltage controlled oscillator output signal with said modulator output signal thereby forming a transmit IF signal, said translation means connected to provide said baseband transmit signal to said frequency translator first port whereby an RF transmit signal is produced, said transmit signal frequency being controlled by a receive signal.

15. A transceiver for generating a transmit signal which is related in frequency to a received signal and time coincident therewith comprising:
- a first frequency conversion means responsive to a receive signal for producing an IF signal,
- a second frequency conversion means responsive to a transmit signal for translating said transmit signal in frequency;
- a reference oscillator producing an signal at a reference frequency; and
- a frequency comparing means responsive to said reference oscillator signal and to said IF signal for producing a control signal related to a frequency difference between said first IF signal and reference frequency;
- said first and second frequency conversion means including a common voltage controlled frequency source and means coupling said control signal to control the frequency of oscillations of said voltage controlled frequency source.

16. A transceiver for generating a transmit signal which is different in frequency to a received signal and time coincident therewith comprising:
- a first frequency conversion means responsive to a receive signal for producing an IF signal;
- a second frequency conversion means response to a transmit signal for translating said transmit signal in frequency to a frequency different from said receive signal frequency;

frequency detector means connected to receive said IF signal, said detector providing a voltage indicating a frequency error of said IF signal;

voltage responsive frequency control means operatively connected to provide a local oscillator signal and frequency translation signal to said first and second frequency conversion means, and to said frequency detector means to receive a frequency control signal, whereby a translated transmit signal frequency and derived IF signal frequency stability are commonly controlled in response to said receive signal.

* * * * *